US007657388B2

(12) United States Patent
Reynolds et al.

(10) Patent No.: US 7,657,388 B2
(45) Date of Patent: Feb. 2, 2010

(54) QUALITY ASSESSMENT TOOL

(75) Inventors: Richard Reynolds, Ipswich (GB); Simon Broom, Ipswich (GB); Paul Barrett, Ipswich (GB)

(73) Assignee: Psytechnics Limited, Ipswich (GB)

( * ) Notice: Subject to any disclaimer, the term of this patent is extended or adjusted under 35 U.S.C. 154(b) by 0 days.

(21) Appl. No.: 10/758,176

(22) Filed: Jan. 15, 2004

(65) Prior Publication Data

US 2004/0153315 A1 Aug. 5, 2004

(30) Foreign Application Priority Data

Jan. 21, 2003 (EP) .................................. 03250365

(51) Int. Cl.
*G01R 29/00* (2006.01)

(52) U.S. Cl. ............................. 702/69; 702/66; 702/79; 702/81; 702/84; 702/179; 704/200; 370/516

(58) Field of Classification Search ................... 702/57, 702/66, 69, 79, 81–83, 182, 187, 84, 176, 702/177, 179; 704/200; 370/516
See application file for complete search history.

(56) References Cited

U.S. PATENT DOCUMENTS 6,327,274 B1 * 12/2001 Ravikanth ................... 370/516
6,363,429 B1 * 3/2002 Ketcham .................... 709/235
6,665,317 B1 * 12/2003 Scott .......................... 370/516
6,868,094 B1 * 3/2005 Bordonaro et al. .......... 370/516
6,928,473 B1 * 8/2005 Sundaram et al. ........... 709/224
2002/0051464 A1 * 5/2002 Sin et al. ..................... 370/466
2002/0141392 A1 * 10/2002 Tezuka et al. ............... 370/352
2003/0018450 A1 * 1/2003 Carley ......................... 702/179
2003/0072269 A1 * 4/2003 Teruhi et al. ................ 370/252
2003/0086425 A1 * 5/2003 Bearden et al. ............. 370/392
2004/0071170 A1 * 4/2004 Fukuda ....................... 370/516

FOREIGN PATENT DOCUMENTS

WO 01/97414 A1 12/2001

OTHER PUBLICATIONS

Cisco Systems, “Evaluate Network Performance with Cisco IOS® Service Assurance Agent”, Sep. 9, 2002.*
Internet Glossary of Statistical Terms, “Variance” and “Standard Deviation”, http://www.animatedsoftware.com/statglos/statglos.htm. Feb. 2002.*

(Continued)

*Primary Examiner*—Jeffrey R West
(74) *Attorney, Agent, or Firm*—Burr & Brown

(57) ABSTRACT

Non-intrusive speech quality assessment method and apparatus for storing a sequence of intercepted packets associated with a call, each packet containing speech data, and an indication of a transmission time of the packet; storing with each intercepted packet an indication of an intercept time of the packet; extracting a set of parameters from the sequence of packets; and generating an estimated mean opinion score in dependence upon the set of parameters. The extracting step comprises the sub steps of: generating a jitter parameter for each packet of the sequence of stored packets; generating a long term average jitter parameter for the stored packet; and generating a differential jitter parameter in dependence upon the jitter parameter for the stored packet and the long term average jitter parameter.

6 Claims, 10 Drawing Sheets

OTHER PUBLICATIONS

Rix, et al, "The perceptual analysis measurement system for robust end-to-end speech quality assessment" Proceedings 2000 IEEE International Conference on Acoustics, Speech, and Signal Processing, vol. 3, Jun. 2000.*

Rix et al, "Perceptual evaluation of speech quality (PESQ)-a new method for speech quality assessment of telephone networks and codecs" Proceedings 2001 IEEE International Conference on Acoustics, Speech, and Signal Processing, vol. 2, May 2001.*

Schulzrinne et al., "RFC 1889—RTP: A Transport Protocol for Real-Time Applications", http://www.faqs.org/rfcs/rfc1889.html, Jan. 1996.*

Demichelis et al., "IP Packet Delay Variation Metric for IP Performance Metrics (IPPM)", ftp://ftp.isi.edu/in-notes/rfc3393.txt, The Internet Society 2002.*

Internet Glossary of Statistical Terms, "Variance" and "Standard Deviation", http://www.animatedsoftware.com/statglos/statglos.htm. Feb. 2002.*

Dechjaroen, "Performance Evaluation of Voice Over Internet Protocol", Thesis—Naval Postgraduate School, Monterey, California. Dec. 2002.*

Rix, A., Broom S. and Reynolds, R.: "Non-intrusive monitoring of speech quality in voice over IP networks" ITU-T Study Group XII Delayed Contribution COM12-D049, Oct. 22-26, 2001, pp. 1-5, XP008018900, Dakar, Senegal.*

Duysburgh B et al: "On the influence of best-effort network conditions on the perceived speech quality of VoIP connections" (Cat. No. 01EX495), Proceedings Tenth International Conference on Computer Communications and Networks, Oct. 15-17, 2001, pp. 334-339, XP010562114, IEEE, USA ISBN: 0-7803-7128-3.

Bin Li et al.: "Experimental results on the impact of cell delay variation on speech quality in ATM networks" ICC 98. Conference Record. 1998 IEEE International Conference on Communications, Jun. 7-11, 1998, pp. 477-481, XP 010284559, ISBN 0-7803-4788-9.

Cole R G et al: "Voice Over IP Performance Monitoring" Computer Communications Review, Association for Computing Machinery, New York, US, vol. 31, No. 2, Apr. 2001, pp. 9-24, XP 001100240, ISSN 0146-4833.

* cited by examiner

QUALITY ASSESSMENT TOOL

This application claims the benefit of European Application 03250365.8, filed Jan. 21, 2003, the entirety of which is incorporated herein by reference.

This invention relates to a non-intrusive speech quality assessment system.

Signals carried over telecommunications links can undergo considerable transformations, such as digitisation, encryption and modulation. They can also be distorted due to the effects of lossy compression and transmission errors.

Objective processes for the purpose of measuring the quality of a signal are currently under development and are of application in equipment development, equipment testing, and evaluation of system performance.

Some automated systems require a known (reference) signal to be played through a distorting system (the communications network or other system under test) to derive a degraded signal, which is compared with an undistorted version of the reference signal. Such systems are known as "intrusive" quality assessment systems, because whilst the test is carried out the channel under test cannot, in general, carry live traffic.

Conversely, non-intrusive quality assessment systems are systems which can be used whilst live traffic is carried by the channel, without the need for test calls.

Non-intrusive testing is required because for some testing it is not possible to make test calls. This could be because the call termination points are geographically diverse or unknown. It could also be that the cost of capacity is particularly high on the route under test. Whereas, a non-intrusive monitoring application can run all the time on the live calls to give a meaningful measurement of performance.

A known non-intrusive quality assessment system uses a database of distorted samples which has been assessed by panels of human listeners to provide a Mean Opinion Score (MOS).

MOSs are generated by subjective tests which aim to find the average user's perception of a system's speech quality by asking a panel of listeners a directed question and providing a limited response choice. For example, to determine listening quality users are asked to rate "the quality of the speech" on a five-point scale from Bad to Excellent. The MOS, is calculated for a particular condition by averaging the ratings of all listeners.

In order to train the quality assessment system each sample is parameterised and a combination of the parameters is determined which provides the best prediction of the MOSs indicted by the human listeners. International Patent Application number WO 01/35393 describes one method for paramterising speech samples for us in a non-intrusive quality assessment system.

This invention relates to improved parameters for assessing speech quality over a packet switched network, in particular over Voice Over Internet Protocol (VOIP) networks.

According to the invention there is provided a method and apparatus for storing a sequence of intercepted packets associated with a call each packet containing speech data, and an indication of a transmission time of said packet; storing with each intercepted packet an indication of an intercept time of said packet; extracting a set of parameters from said sequence of packets; and generating an estimated mean opinion score in dependence upon said set of parameters; characterised in that the extracting step comprises the sub steps of: generating a jitter parameter for each of a sequence of stored packets in dependence upon the difference between the transmission time of a stored packet and the transmission time of a preceding stored packet of the sequence; and the difference between the intercept time of said stored packet and the intercept time of said preceding packet; generating a long term average jitter parameter for said stored packet in dependence upon the value of said jitter parameter for said stored packet and the value of said jitter parameter for any preceding stored packets; and generating a differential jitter parameter in dependence upon the jitter parameter and the long term jitter differential parameter.

Embodiments of the invention will now be described, by way of example only, with reference to the accompanying drawings, in which.

Figure 4:
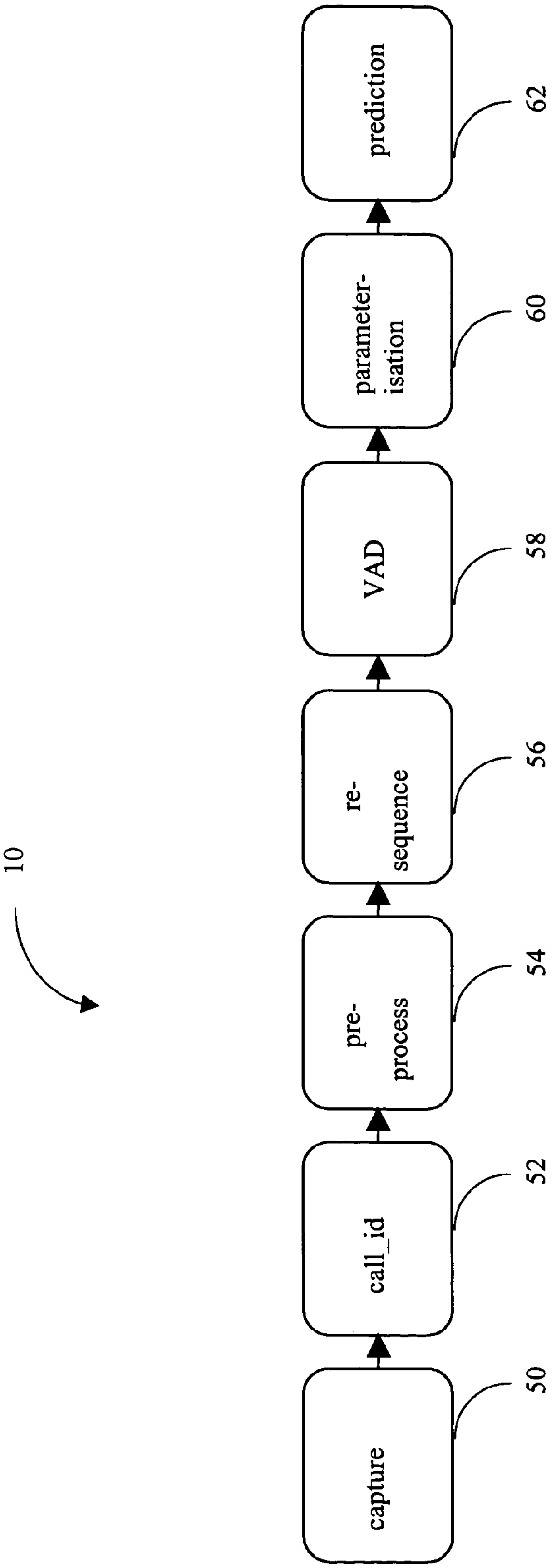
FIG. 4 is a block diagram illustrating functional block of an apparatus for quality assessment.
Figure 4A:
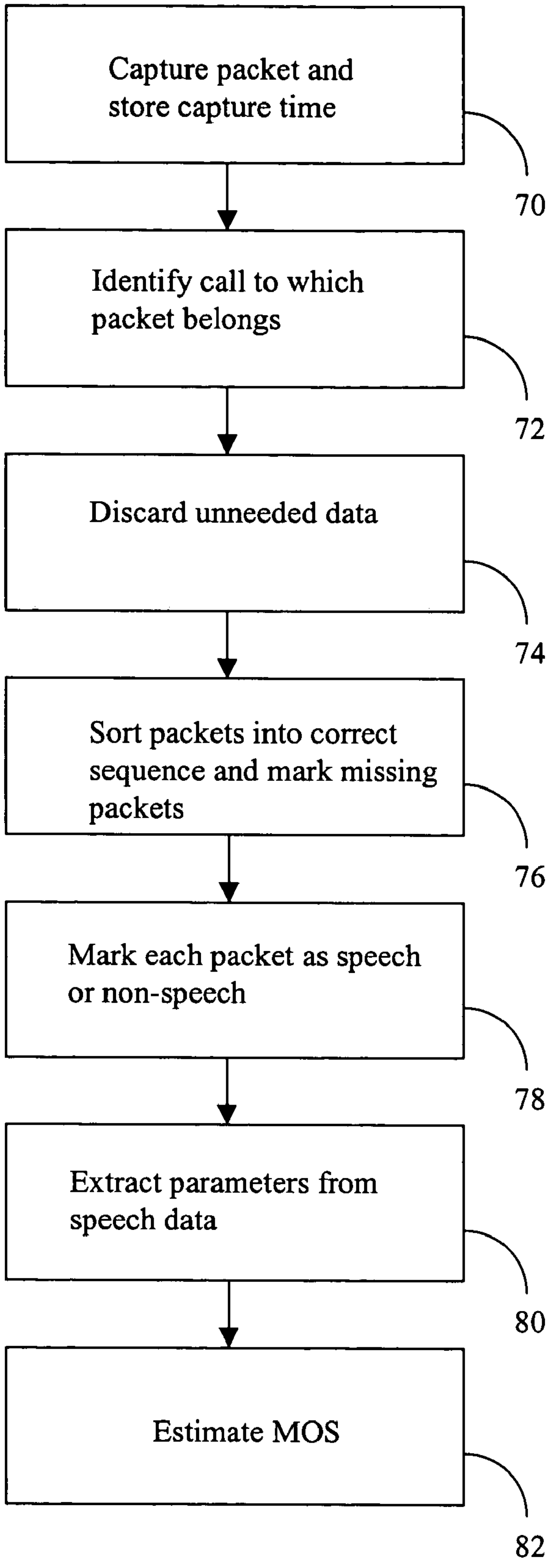
Figure 5:
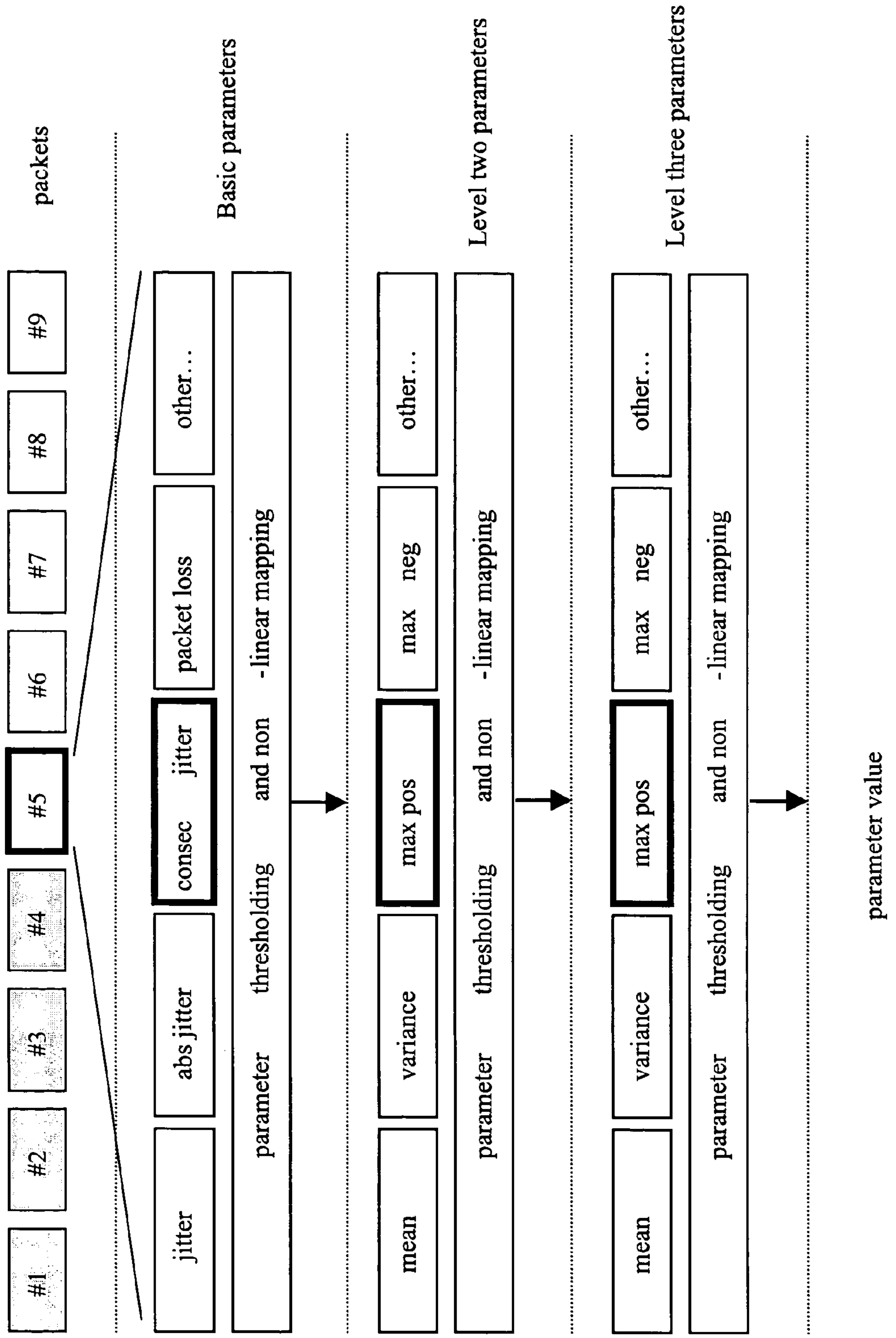
Figure 5A:
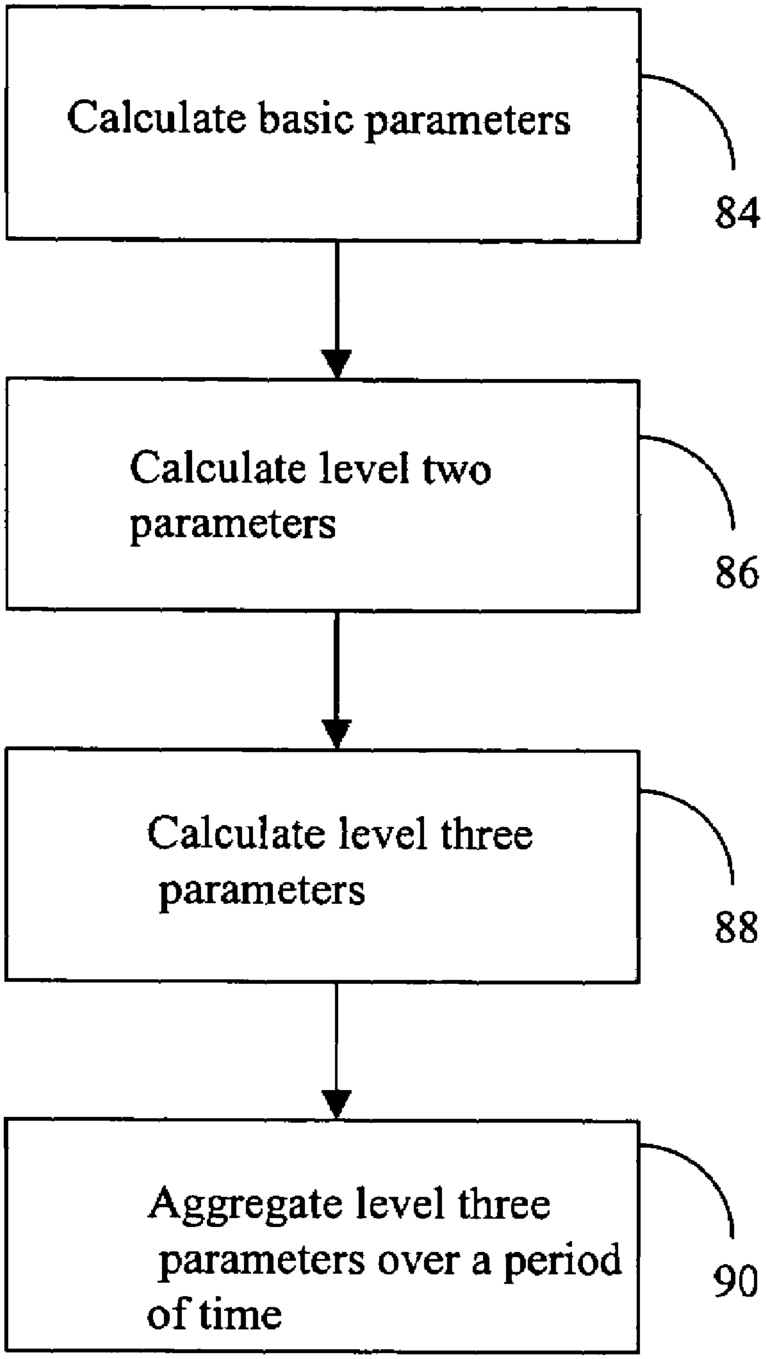
Figure 6:
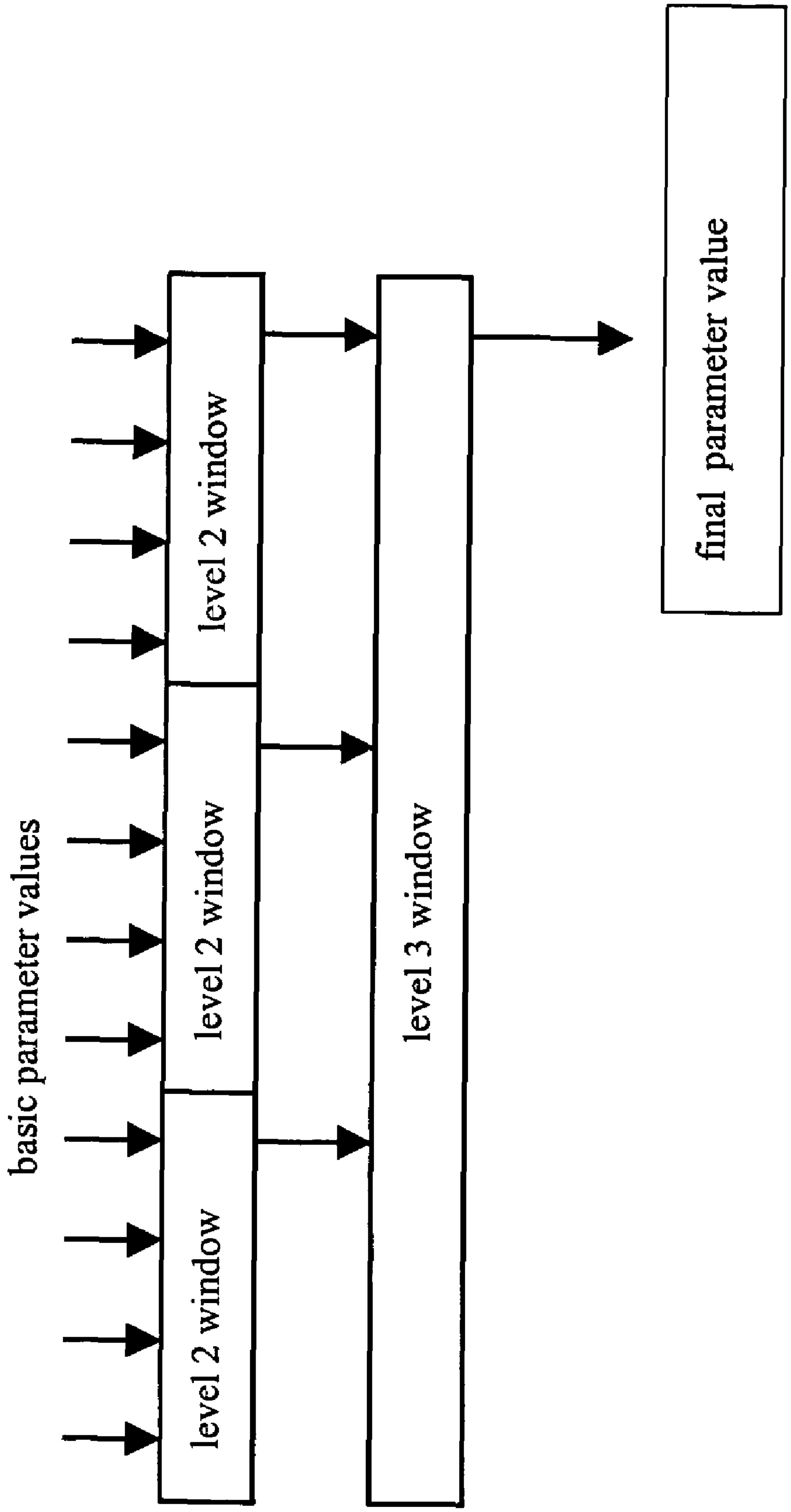
Figure 7:
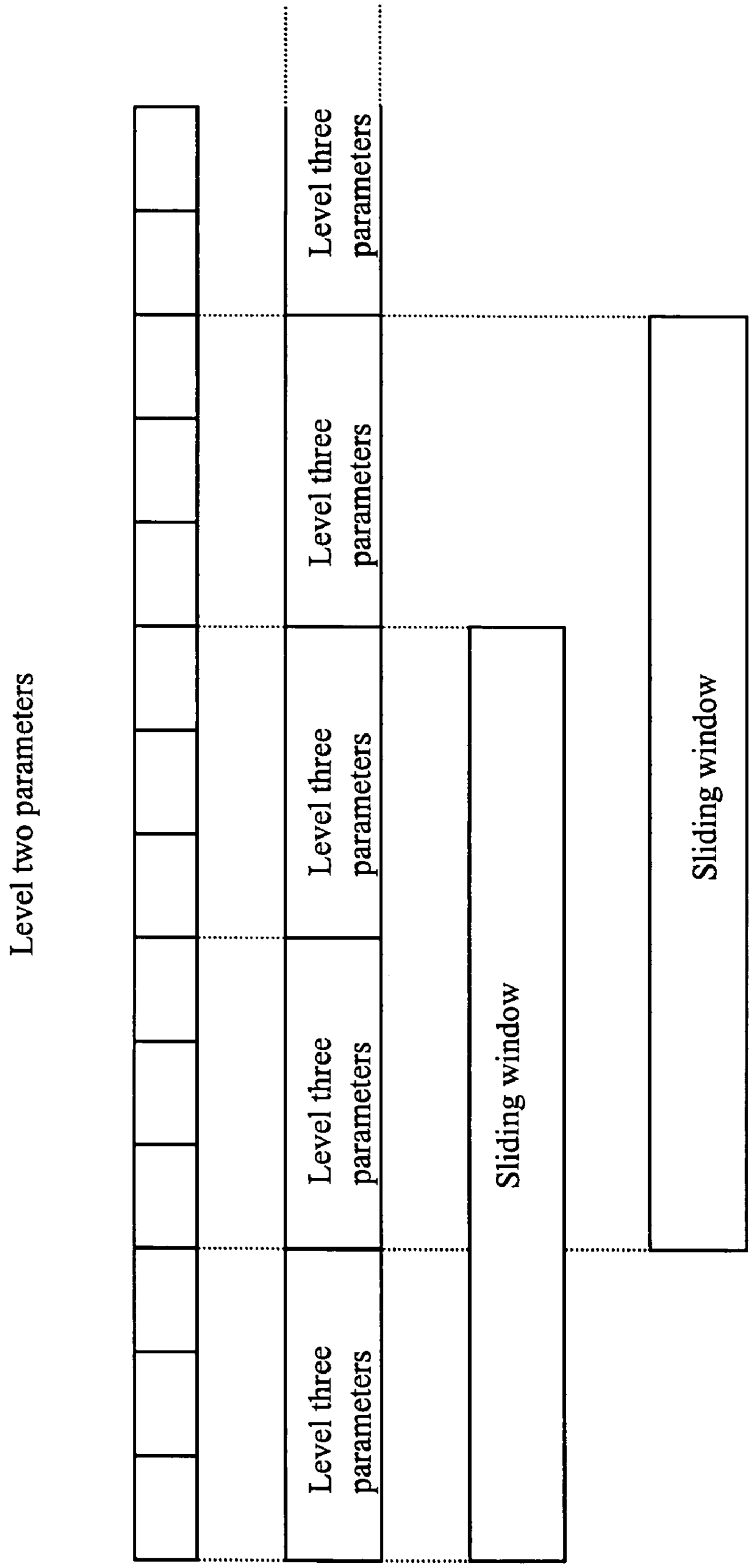

FIG. 4*a* is a flow chart illustrating the steps carried out by the apparatus of FIG. 4;

FIG. 5 is an illustration of parameters produced by a parameterisation process;

FIG. 5*a* is a flow chart showing abroad overview of a parameterisation process;

FIG. 6 illustrates combination of parameters at various levels;

FIG. 7 illustrates use of a sliding window; and

Figure 1:
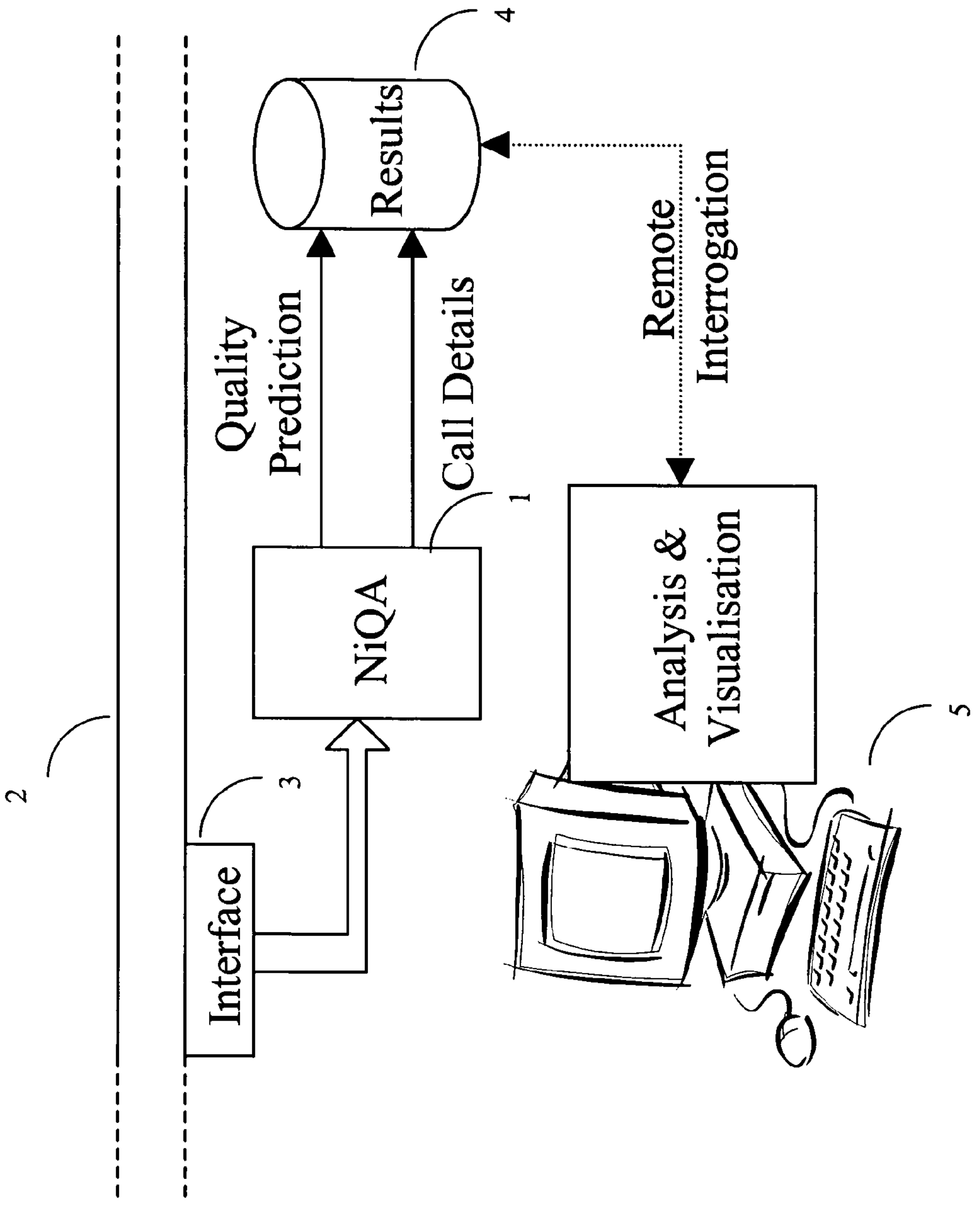
FIG. 1 is a schematic illustration of a non-intrusive quality assessment system.
Figure 8:
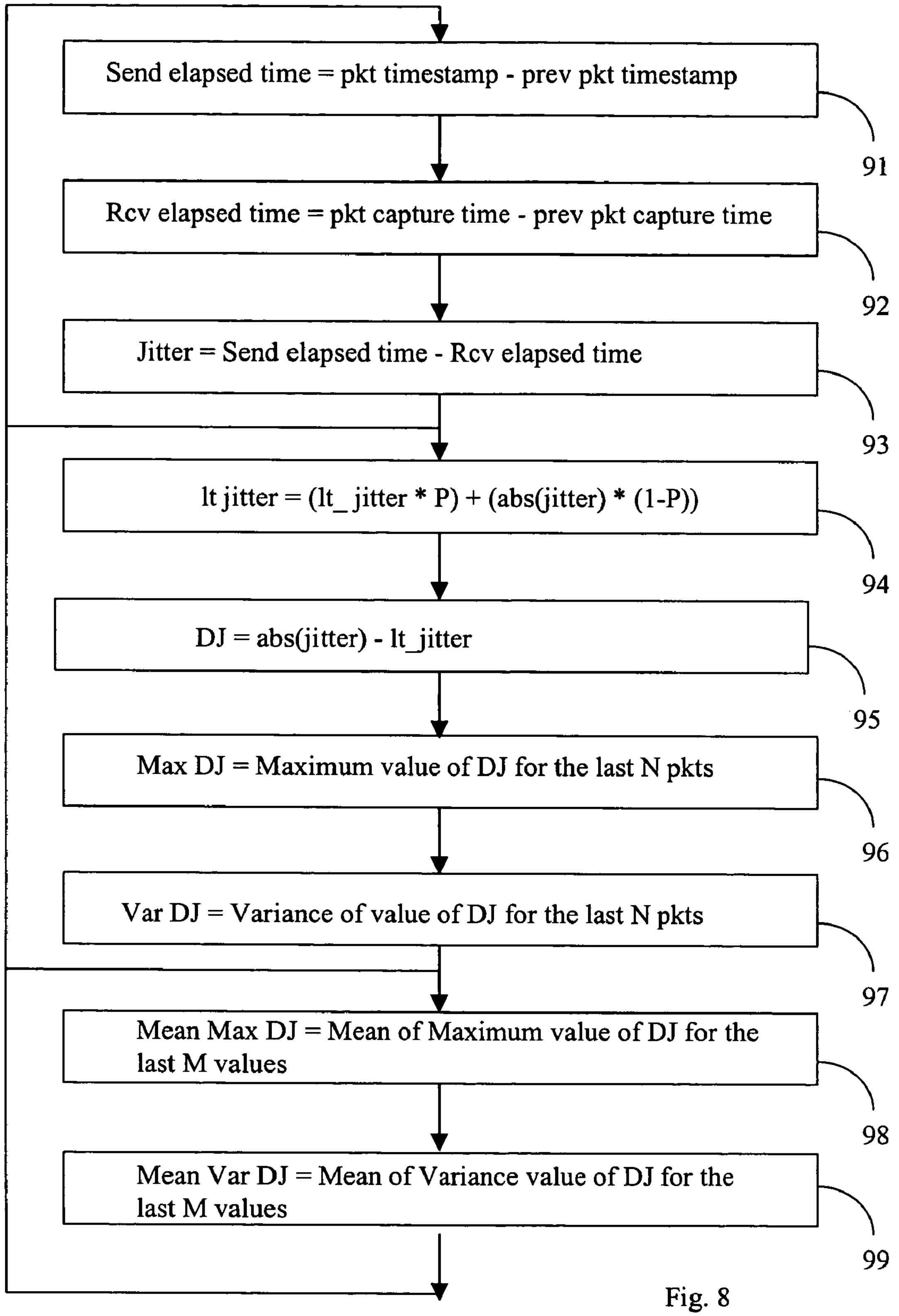

FIG. 8 is a flow chart illustrating calculation of a particular parameter;

Referring to FIG. 1, a non-intrusive quality assessment system 1 is connected to a communications channel 2 via an interface 3. The interface 3 provides any data conversion required between the monitored data and the quality assessment system 1. A data signal is analysed by the quality assessment system, as will be described later and the resulting quality prediction is stored in a database 4. Details relating to data signals which have been analysed are also stored for later reference. Further data signals are analysed and the quality prediction is updated so that over a period of time the quality predication relates to a plurality of analysed data signals.

The database 4 may store quality prediction results resulting from a plurality of different intercept points. The database 4 may be remotely interrogated by a user via a user terminal 5, which provides analysis and visualisation of quality prediction results stored in the database 4.

Figure 2:
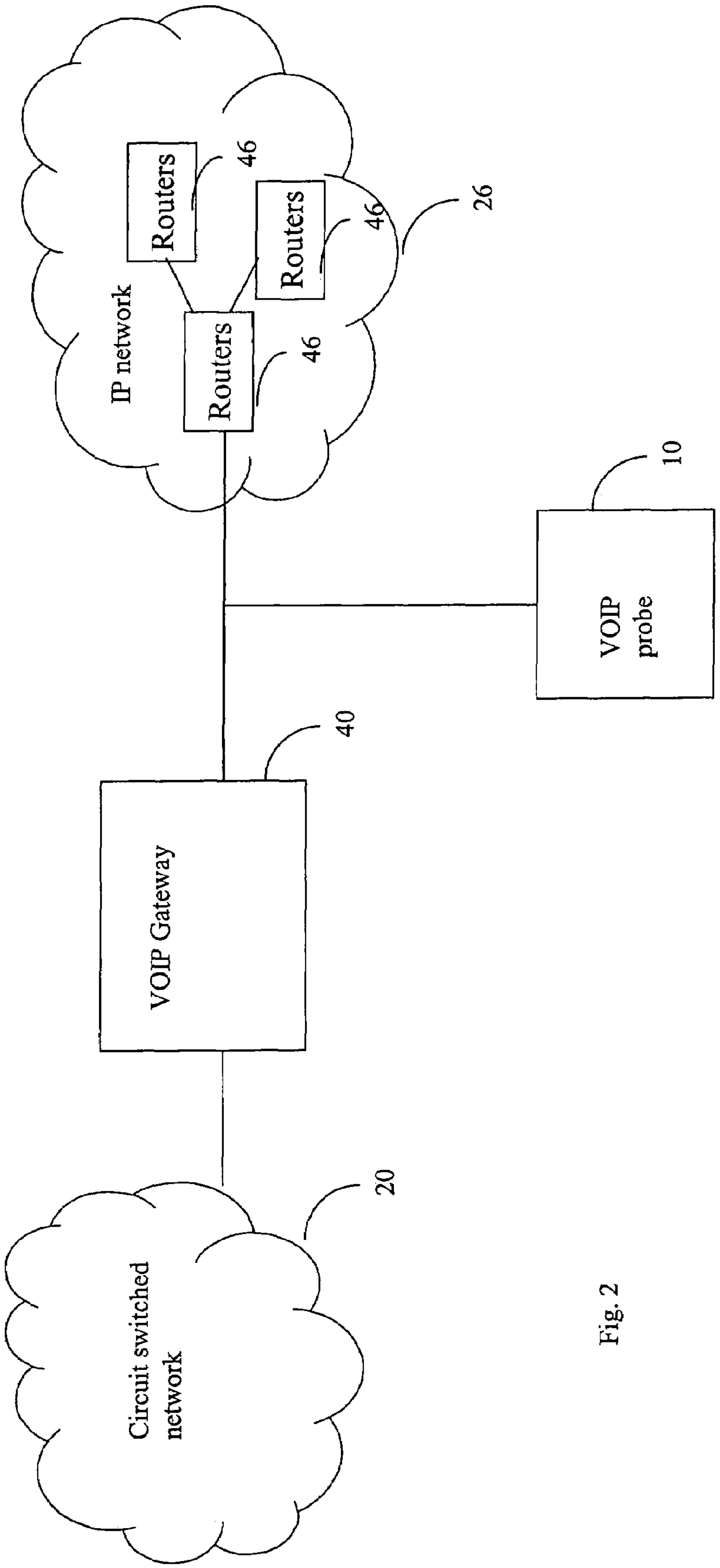
FIG. 2 is a block diagram illustrating a non-intrusive quality assessment system monitoring calls between an IP network and a circuit switched network.

Referring now to FIG. 2, a VOIP gateway 40 converts data at an interface between a circuit switched network 20 and an IP network 26. The IP network 26 comprises a plurality of IP routers 46. A VOIP probe 10 monitors VOIP calls to assess quality of speech provided by the IP network.

VOIP can be divided into two broad system types; systems that transport voice over the Internet and systems that carry voice across a managed IP network.

The VOIP packet stream itself is well defined so VOIP calls can be identified either by monitoring call control signalling and extracting call set-up messages or by being able to recognise VOIP packets. The probe 10 of the present invention recognises VOIP packets as this enables calls to be identified even if the start of the call is missed. This technique also avoids problems when the packet stream and signalling information travel via different routes.

In order to monitor the speech quality of a VOIP from within the IP network, there is a need to account for the highly non-linear VOIP gateway 40.

The probe 10 needs to account for each gateway according to the properties of the gateway because different gateway implementations respond to the effects of IP transmission in varying ways.

Figure 3:
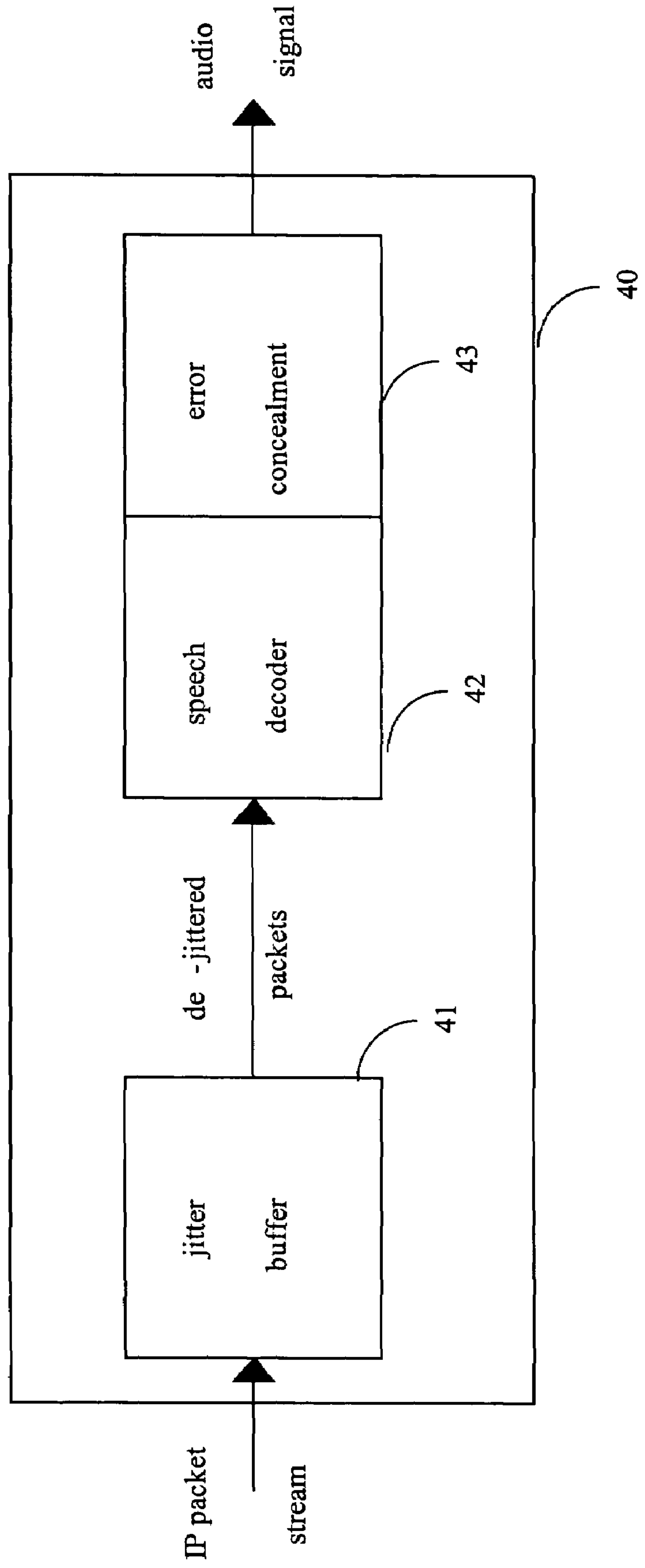
FIG. 3 is a block diagram of a VOIP gateway.

FIG. 3 illustrates a simple VIOP gateway 40. A jitter buffer 41 receives an IP packet stream. The jitter buffer 41 removes jitter and re-orders any mis-sequenced packets. The packets are then sent to a speech decoder 42 in the appropriate time sequence where they are decoded.

An error concealer 43 uses error concealment techniques to mask any missing packets to provide an audio signal.

There are numerous VOIP gateway manufacturers—each produces a number of different gateways, each one operating slightly differently. It would be ideal if all of these gateways could be assumed to produce the same speech quality output from a given IP packet stream—but in fact different gateways will produce different speech quality scores from the same IP packet stream.

For example, a single manufacturer may use a variety of different jitter buffer algorithms for the jitter buffer 41. The impact on speech quality of the jitter buffer is heavily dependent on the effectiveness of a specific algorithm and implementation.

Speech decoders are generally standardised and well known. However, the effects of additional error concealment when encountering lost packets vary. Both jitter buffer and error concealment algorithms tend to be proprietary and can vary widely from gateway to gateway.

Therefore to accurately predict a speech quality MOS from an IP packet stream (or even a post jitter-buffer packet stream) non-intrusive predictors, such as the VOIP probe 10 of the present invention, need to take account of the specific gateway in use.

The probe 10 is calibrated for each different type of VOIP gateway which is supported. The calibration process involves characterising a gateway's speech quality performance over a wide range of network conditions. Once a gateway has been characterised this information is stored in a calibration file, which can be loaded on command into the probe 10 and used to achieve highly accurate quality monitoring.

If a gateway is used which has not been calibrated then the probe 10 can still be used. However, in this case the output may not be representative of a MOS.

The probe 10 will now be described in more detail with reference to FIG. 4 and FIG. 4*a*. FIG. 4 illustrates means for performing a quality assessment process, and FIG. 4*a* illustrates the method steps to be carried out by the apparatus of FIG. 4.

Capture module 50 at step 70 captures and stores an IP packet, and records the time of capture. Any corrupt packets are discarded. A call identification module 52 identifies to which call a captured packet belongs at step 72. A pre-process module 54 discards any information from the captured packet which is no longer needed at step 74, in order to reduce memory and processing requirements for subsequent modules.

A resequence buffer 56 is used to store packet data, and to either pass the data to subsequent modules in sequence, or provide an indication that the data did not arrive at the correct time at step 76. The resequence buffer 56 used in this embodiment of the invention is a simple cyclic buffer.

A voice activity detector 58 labels each packet as either speech or silence at step 78. 'Missing' packets are classified to the same classification as the immediately preceding packet.

Parameterisation module 60 extracts parameters from the packet data at step 80 in order to provide a set of parameters which are indicative of the likely MOS for the speech signal carried by the sequence of packet data associated with a particular call.

A prediction module 62 is then used to predict the MOS at step 82 based on a sequence of parameters received from the parameterisation module 60. A MOS will not be calculated until a predetermined number of packets associated with a particular monitored call have been received.

The parameterisation module will now be described with reference to FIGS. 5 to 8.

Parameters which are used for a particular gateway are defined within the calibration file. Parameters are calculated as follows. Every time new packet data is received from the VAD module 58 basic parameters are calculated. These basic parameters are combined over time in various ways to calculate 'level two' parameters. The level two parameters are then used to calculate 'level three' parameters.

FIG. 5 and FIG. 5*a* broadly illustrate this process. For example, when packet data (number 5) is received from the VAD module 58, parameters relating to jitter, absolute jitter, consecutive positive jitter, packet loss etc are calculated at step 84. These parameters are combined with previously calculated basic parameters in order to calculate level two parameters such as mean, variance, maximum positive value, maximum negative value, sum, difference, running mean, running variance etc. at step 86 For example, level two parameters may include, jitter mean, jitter variance, absolute jitter mean etc.

The level two parameters are combined with previously calculated level two parameters at step 88 in a similar manner to provide level three parameters such as mean, variance, maximum positive value, maximum negative value etc. For example level three parameters may include, maximum positive value of the jitter mean, variance of the jitter variance etc.

FIG. 6 illustrates such combination of parameters to provide a final parameter value at step 90. In the example illustrated four basic parameters are combined to provide each level two parameter, three level two parameters are combined to provide a level three parameter.

Finally the level three parameters are combined using a sliding window mechanism which simply sums a predetermined number of previously calculated level three parameters.

This sliding window mechanism is illustrated in FIG. 7, where the sliding window sums the previous three level three parameters.

The calculation of the basic parameter jitter will now be described with reference to FIG. 8 which illustrates part of the basic parameterisation of step 84.

Jitter is defined to be the difference between the elapsed time between sending two packets of data and the elapsed time between receiving two packets of data.

Every time new packet data is sent to the parameterisation module 60 a jitter basic parameter is calculated as follows: each packet of data contains a timestamp indicating when the packet was sent. Therefore, elapsed time between sending two packets of data is equal to the packet timestamp minus the previous packet timestamp and is calculated at step 91. Elapsed time between receipt of two packets is calculated using the time of capture recorded by the capture module 50. Therefore elapsed time between receipt of two packets is equal to the packet capture time minus the previous packet capture time and is calculated at step 92, allowing jitter to be calculated from these two values at step 93.

The calculation of the basic parameter short term/long term jitter differential will now be described.

There are two aspects to jitter, both short term differences and a long term effects. The jitter buffer 41 in the VOIP gateway 40 (FIG. 3) will absorb some of the long term effects of jitter, so these do not necessarily affect the perceived speech quality as much as short term differences. Short-term peaks (or troughs) in jitter have been found to adversely affect speech quality, and therefore a parameter which reflect these short term aspects is very useful for predicting/estimating a MOS.

The jitter parameter is used to calculate a long-term average of the jitter. A predetermined adaptation rate P is used, and the long term average (lt_jitter) is calculated at step 94 according to the following equation:

$$lt\_jitter=(lt\_jitter*P)+(abs(jitter)*(1-P))$$

it is worth noting that the absolute value of jitter is used because the size of the difference from a value of zero (no jitter) is important.

A differential jitter (jitter_differential) parameter is then calculated at step 95 as follows:

$$jitter\_differential=abs(jitter)-lt\_jitter$$

The value of the basic differential jitter (DJ) parameter is then used as described previously to calculate level two parameters such as maximum positive value at step 96, mean value (not shown), variance of the value at step 97; and level three parameters are then calculated such as mean of the maximum positive value at step 98 or mean of the variance of the value at step 99.

It will be understood by those skilled in the art that the processes described above may be implemented on a conventional programmable computer, and that a computer program encoding instructions for controlling the programmable computer to perform the above methods may be provided on a computer readable medium.

It will be understood that various alterations, modifications, and/or additions may be introduced into the specific embodiment described above without departing from the scope of the present invention.

The invention claimed is:

1. A method of assessing speech quality transmitted via a packet based telecommunications network comprising the steps of:

storing a sequence of intercepted packets associated with a call, each packet containing speech data, and an indication of a transmission time of said intercepted packet;

storing with each intercepted packet an indication of an intercept time of said packet;

extracting a set of parameters from said sequence of intercepted packets;

generating an estimated mean opinion score in dependence upon said set of parameters; and storing said estimated mean opinion score on a computer-readable medium accessible by a user for visualization and analysis, wherein the extracting step comprises the sub steps of:

generating a jitter parameter for each packet of said sequence of stored packets in dependence upon a difference between the transmission time of a stored packet and the transmission time of a preceding stored packet of the sequence, and a difference between the intercept time of said stored packet and the intercept time of said preceding stored packet;

generating a long term average jitter parameter (lt_jitter) for said stored packet in dependence upon the value of said jitter parameter (jitter) for said stored packet, the value of said jitter parameter for any preceding stored packets, and a predetermined adaptation rate (P) according to the equation:

$$lt\_jitter=(lt\_jitter*P)+(abs(jitter)*(1-P));$$ and generating a differential jitter parameter in dependence upon the jitter parameter for said stored packet and the long term average jitter parameter;

and in which said set of parameters includes said differential jitter parameter.

2. A method according to claim 1, in which the extracting step further comprises the sub step of generating a plurality of differential jitter parameters for a plurality of said stored packets;

determining a maximum value of said plurality of said differential jitter parameters.

3. A method according to claim 2 in which the extracting step further comprises the sub steps of:

generating a plurality of maximum values for a plurality of sub-sequences of said stored packets;

determining an average for a sequence of said maximum values.

4. A method according to claim 1, in which the extracting step further comprises the sub step of generating a plurality of differential jitter parameters for a plurality of said stored packets;

determining a variance value of said plurality of said differential jitter parameters.

5. A method according to claim 4 in which the extracting step further comprises the sub steps of:

generating a plurality of variance values for a plurality of sub-sequences of said stored packets;

determining an average for a sequence of said variance values.

6. An apparatus for assessing speech quality transmitted via a packet based telecommunications network comprising:

means for storing a sequence of intercepted packets associated with a call, each packet containing speech data, and an indication of a transmission time of said packet;

means for storing with each intercepted packet an indication of an intercept time of said intercepted packet;

means for extracting a set of parameters from said sequence of intercepted packets;

means for generating an estimated mean opinion score in dependence upon said set of parameters; and means for storing said estimated mean opinion score on a computer-readable medium accessible by a user for visualization and analysis, wherein the means for extracting further comprises:

means for generating a jitter parameter for each intercepted packet of said sequence of stored intercepted packets in dependence upon a difference between the transmission time of a stored intercepted packet and the transmission time of a preceding stored packet of the sequence, and a difference between the intercept time of said stored intercepted packet and the intercept time of said preceding stored intercepted packet;

means for generating a long term average jitter parameter (lt_jitter) for said stored packet in dependence upon the value of said jitter parameter (jitter) for said stored intercepted packet, the value of said jitter parameter for any preceding stored intercepted packets and a predetermined adaptation rate (P) according to the equation: lt_jitter=(lt_jitter*P)+(abs(jitter)*(1−P)); and means for generating a differential jitter parameter in dependence upon the jitter parameter for said stored intercepted packet and the long term average jitter parameter;

and in which said set of parameters includes said differential jitter parameter.

* * * * *